United States Patent [19]
Isbara

[11] Patent Number: 6,081,132
[45] Date of Patent: Jun. 27, 2000

[54] HIGH VOLTAGE DRIVE OUTPUT BUFFER FOR LOW VOLTAGE INTEGRATED CIRCUITS

[75] Inventor: Melik Isbara, Fort Collins, Colo.

[73] Assignee: Intel Corporation, Santa Clara, Calif.

[21] Appl. No.: 09/038,680

[22] Filed: Mar. 9, 1998

[51] Int. Cl.[7] .............................................. H03K 19/0185
[52] U.S. Cl. ............................................... 326/81; 326/86
[58] Field of Search .................... 326/68, 80–81, 326/83, 86, 121, 57–58

[56] References Cited

U.S. PATENT DOCUMENTS

| | | | |
|---|---|---|---|
| 5,300,832 | 4/1994 | Rogers | 326/57 |
| 5,440,249 | 8/1995 | Schucker et al. | 326/81 |
| 5,506,535 | 4/1996 | Ratner | 326/81 |
| 5,559,464 | 9/1996 | Orii et al. | 326/80 |
| 5,834,948 | 11/1998 | Yoshizaki et al. | 326/81 |

*Primary Examiner*—Jon Santamauro
*Attorney, Agent, or Firm*—Seth Z. Kalson

[57] ABSTRACT

A high voltage drive output buffer for low voltage integrated circuits comprising a pullup pFET; a driver pFET having a source connected to the drain of the pullup pFET, and having a gate connected to a biasing circuit; a driver nFET having a drain connected to the drain of the driver pFET, and having a gate connected so as to be biased; and a pulldown nFET having a drain connected to the source of the driver nFET; wherein the pullup pFET and pulldown nFET are coupled to switch in complementary fashion in response to an input voltage; and wherein the biasing circuit comprises an nFET having a drain connected to the gate of the driver pFET and coupled to the input node so as to switch ON for a transitory period when the pullup pFET switches from OFF to ON.

11 Claims, 1 Drawing Sheet

6,081,132

HIGH VOLTAGE DRIVE OUTPUT BUFFER FOR LOW VOLTAGE INTEGRATED CIRCUITS

BACKGROUND

It is often necessary to interface low voltage integrated circuits with higher voltage integrated circuits. In particular, a low voltage integrated circuit may need to interface with a bus operating at a higher supply voltage, so that a driver buffer is required for proper interfacing. It is desirable for such a buffer circuit to be manufactured with the same technology process as the low voltage integrated circuit, so that the buffer is integrated with and becomes part of the integrated circuit. However, low voltage integrated circuits may have smaller gate-oxide breakdown voltages than higher voltage integrated circuits. It is therefore desirable for a buffer circuit designed with a low voltage technology process to drive a bus at higher voltages without suffering gate-oxide breakdown.

BRIEF DESCRIPTION OF THE DRAWING

In FIG. 1, driver output buffer 100 drives a bus line (not shown) connected to pad or terminal 102 to either ground or voltage $V_{ccp}$ in response to a data input voltage on terminal 104 when oe# terminal 106 is asserted (oe# is held LOW). When oe# is held HIGH, driver output buffer 100 is "tristated", i.e., it presents a very large impedance path from terminal 102 to ground and to $V_{ccp}$. All of the devices in FIG. 1 operate at a technology appropriate to a voltage range [0, $V_{cc}$], where $V_{cc} < V_{ccp}$.

Figure 1:
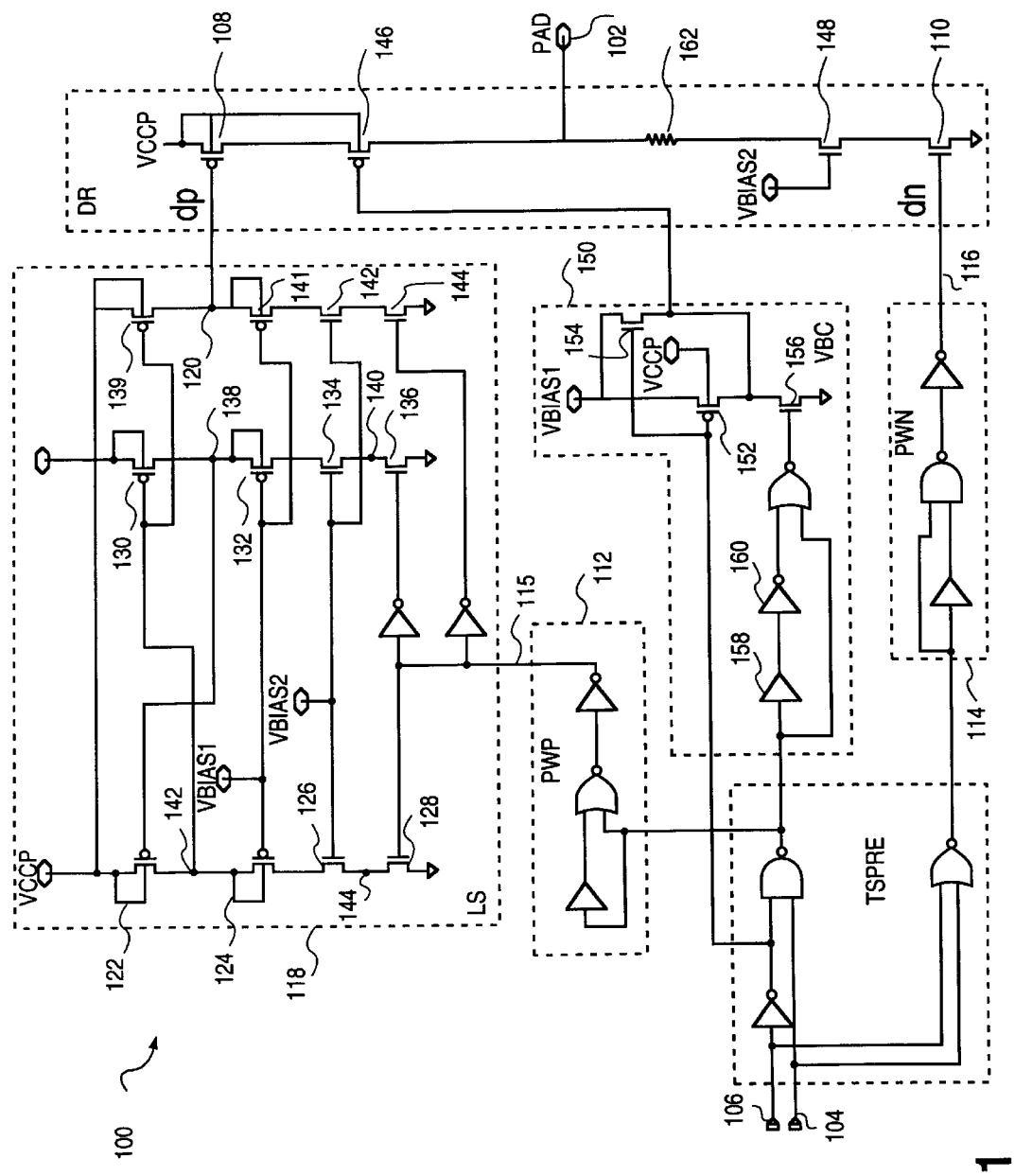
FIG. 1 illustrates an embodiment of a high voltage drive output buffer for low voltage integrated circuits.

Pullup pMOSFET 108 and pulldown nMOSFET 110 are coupled to terminal 104 so as to switch in complementary fashion. With pMOSFET 108 ON and nMOSFET 110 OFF, terminal 102 is at $V_{ccp}$, and with pMOSFET 108 OFF and nMOSFET 110 ON, terminal 102 is at ground (i.e., the substrate).

Sub-circuits 112 and 114 time the switching of pMOSFET 108 and nMOSFET 110 so that both are not ON simultaneously. This is observed by noting that a LOW pulse on line 115, which causes pMOSFET 108 to switch ON, and a LOW pulse on line 116, which causes nMOSFET 110 to switch OFF, are such that line 116 is held LOW before line 115 is held LOW and is held LOW for a period of time longer than line 115 is held LOW.

We now consider the operation of sub-circuit 118. The voltage on line 115 is in the range [0, $V_{cc}$]. Sub-circuit 118 performs a level shift function, where the voltage at node 120 switches between $V_{ccp}$ and approximately $V_{bias1}+V_{th}$, where $V_{th}$ is the threshold voltage, where for simplicity of discussion only, we assume that all threshold voltages for all pMOSFETs and nMOSFETs are essentially equal to one another. (This is not a requirement for any embodiment.) That is, sub-circuit 118 performs a level shift in voltages from the range [0, $V_{cc}$] onto the range [$V_{bias1}+V_{th}$, $V_{ccp}$]. We assume $V_{bias1}+V_{th}<V_{ccp}$. The gates of pMOSFETs 124 and 132 are biased to $V_{bias1}$, although they may be biased to different voltages.

Consider the operation of transistors 122, 124, 126, 128, 130, 132, 134, and 136. These transistors switch among two states. In one state, which we refer to as state L, transistors 122, 124, 126, 128, 130, 132, 134, and 136 are, respectively, ON, ON, OFF, OFF, OFF, OFF, ON, and ON. The other state, which we refer to as state H, is the complement of state L (i.e., substitute "OFF" for "ON" and "ON" for "OFF" in the description of state L). In state L, the voltage on line 115 is LOW and the voltage at node 138 is $V_{bias1}+V_{th}$. (Note that at node 138 $V_{bias1}+V_{th}$ is also interpreted as LOW because within that part of the circuit the voltages are within the range of [$V_{bias1}+V_{th}$, $V_{ccp}$]). In state H, the voltage on line 115 is HIGH and the voltage at node 138 is $V_{ccp}$, which is HIGH at node 138.

Transistors 126 and 134 have their gates biased to $V_{bias2}$, however, in other embodiments they may be biased to different voltages. The effect of biasing transistors 124, 138, 126, and 134 is to provide a mechanism by which technology may be employed in which the gate-oxide breakdown voltage, denoted as $V_B$, is less than $V_{ccp}$. With transistor 132 biased, the voltage at node 138 (when the circuit is switching) is prevented from falling below $V_{bias1}+V_{th}$. That is, transistor 132 cannot pull node 138 below $V_{bias1}+V_{th}$, without shutting itself OFF because its source-gate voltage must be at or above $V_{th}$ for it to remain ON. A similar statement applies to node 142. With transistor 134 biased, the voltage at node 140 is prevented from exceeding $V_{bias2}-V_{th}$. That is, transistor 134 cannot pull node 140 above $V_{bias2}-V_{th}$ because, since it is an nMOSFET, its gate-source voltage must be at or above $V_{th}$ for it to remain ON. Similarly for node 144. Provided the bias voltages are chosen such that $V_{ccp}-V_B<V_{bias1}<V_B$ and $V_{ccp}-V_B<V_{bias2}<V_B$, all source-gate and gate-drain voltages are in magnitude less than $V_B$, and gate-oxide breakdown is prevented. Note that these inequalities imply that we should have $V_{ccp}<2V_B$.

To observe how these transistors switch between states, assume that they are initially in state L and the voltage on line 115 switches to HIGH to bring the circuit into state H. Transistor 136 will switch OFF and transistor 128 will switch ON. With transistor 128 ON, the voltage at node 144 will be pulled down toward ground, and transistor 126 will switch ON because its gate-source voltage will begin to exceed $V_{th}$. Initially, in state L, transistors 122 and 124 are ON and node 142 is at $V_{ccp}$, and therefore the voltage at node 142 will be pulled down to $V_{bias1}+V_{th}$. (Note that transistors 122 and 124 are "fighting" with transistors 126 and 128, so they should be sized such that the nMOSFETs can "win" over the pMOSFETs to pull node 142 down. An explicit relationship between the relative sizes depends on the technology and the voltage levels.) With the gate of transistor 130 connected to node 142, transistor 130 will switch ON when node 142 is pulled below $V_{ccp}-V_{th}$ as it is being pulled down to $V_{bias1}+V_{th}$. With transistor 130 ON, node 138 will be pulled up to $V_{ccp}$, which causes transistor 122 to switch OFF. With node 138 pulled to $V_{ccp}$, transistor 132 will switch ON because its source-gate voltage will exceed $V_{th}$. Initially, in state L, transistor 134 is ON, and therefore node 140 is pulled up because transistors 130 and 132 are now ON. However, as discussed before, node 140 can be pulled up to only $V_{bias2}-V_{th}$ before it switches OFF.

Therefore, as discussed above, we see that transistors 122, 124, 126, 128, 130, 132, 134, and 136 switch from state L to state H when the voltage on line 115 switches from LOW to HIGH. Because of symmetry, these transistors switch from state H to state L when the voltage on line 115 switches from HIGH to LOW.

It is necessary to drive the gate of pMOSFET 108, which must be sized appropriately to drive a bus connected to terminal 102. Therefore, in one embodiment, transistors 139, 141, 142, and 145 are added and are "slaved" to transistors 130, 132, 134, and 136, respectively, and are sized to drive transistor 108, so that the gate of transistor 108 is connected to node 120 rather than node 138. The gate of transistor 108 will therefore be driven between $V_{bias1}+V_{th}$ (LOW) and $V_{ccp}$ (HIGH).

The circuit connection of transistors 108, 146, 148, and 110 are very similar to that of transistors 130, 132, 134, and 136. For the moment, ignore biasing circuit 150 and assume that the gate of transistor 146 is biased to $V_{bias1}$. (In other embodiments, the gates of transistors 146 and 148 may be biased to other voltages than those shown.) Then, for the same reasons as discussed earlier, the drain of transistor 108 is prevented from falling below $V_{bias1}+V_{th}$ and the drain of transistor 110 is prevented from exceeding $V_{bias2}-V_{th}$. Furthermore, the gate-oxides of transistors 108, 146, 148, and 110 will not be exceeded (assuming that the breakdown voltage is approximately the same as the other transistors discussed above).

We now consider the need for and operation of biasing circuit 150. Because transistor 146 is large, its gate-to-drain capacitance is relatively large. When input data at 104 transitions from LOW to HIGH, node 102 transitions from LOW to HIGH. However, because of the gate-to-drain capacitance of transistor 146, the gate voltage of transistor 146 will tend to follow the voltage of node 102. Thus, node 102 transitioning from LOW to HIGH will tend to reduce the gate-to-source voltage of transistor 146, which in turn may cause transistor 146 to switch OFF if its gate voltage is not controlled otherwise. Biasing circuit 150 is introduced to mitigate this unwanted effect.

To observe this, assume oe# is LOW, so that pMOSFET 152 is OFF. Transistor 154 will be held ON and transistor 156 is OFF except for a short transitory period when the input voltage at data input terminal 104 switches from LOW to HIGH. The duration of this transient ON period depends upon the delays introduced by buffer 158 and inverter 160. This transitory ON period coincides with pMOSFET 108 switching ON to bring terminal 102 HIGH. Therefore, when node 102 transitions from LOW to HIGH, transistor 156 briefly turns ON and tries to pull the gate of transistor 146 to ground. The effect of the LOW to HIGH transition of node 102 trying to raise the gate voltage of transistor 146 tends to cancel the effect of transistor 156 trying to pull the gate of transistor 146 to ground, resulting in a relatively constant gate voltage for transistor 146.

When oe# terminal 106 is held HIGH, then pMOSFET 152 is ON and nMOSFETs 154 and 156 are OFF. This provides a constant bias voltage $V_{bias1}$ to the gate of pMOSFET 146, so as to provide a constant impedance to terminal 102 when buffer 100 is tristated.

Component 162 is not a lumped resistor in the classical circuit sense. It is a distributed resistor in series with the drain of transistor 148. Its purpose is to spread any current due to electrostatic discharges across the drain of transistor 148, thus protecting it from any permanent damage. The voltage drop across component 162 is very small, and may be neglected.

Various modifications may be made to the embodiments discussed above without departing from the scope of the invention as claimed below. For example, additional devices may be inserted between various nodes, terminals, and devices in the above embodiments without materially changing their overall function. For example, voltage drops may be introduced by diodes, or transistors configured as diodes, to change various voltage levels, or buffers may be inserted between various nodes, terminals, and devices.

What is claimed is:

1. A buffer having an output node, and an input node with an input voltage, the buffer comprising:

a pullup pFET;

a driver pFET coupled to the pullup pFET to prevent the voltage of the drain of the pullup pFET from falling below $V_{D1}+V_{thD1}$ where $V_{D1}$ and $V_{thD1}$ are, respectively, the gate bias and threshold voltages of the driver pFET;

a pulldown nFET, wherein the pulldown nFET and the pullup pFET are coupled to the input node to switch ON and OFF in complementary fashion in response to the input voltage;

a driver nFET coupled to the pulldown nFET to prevent the voltage of the drain of the pulldown nFET from exceeding $V_{D2}-V_{thD2}$ where $V_{D2}$ and $V_{thD2}$ are, respectively, the gate bias and threshold voltages of the driver nFET; wherein the pullup pFET, the driver pFET, the pulldown nFET, and the driver nFET are coupled in series to drive the output node HIGH and LOW in response to the input voltage; and a bias pulldown nFET coupled to provide a transitory low impedance path from the gate of the driver pFET to ground only if the pullup pFET switches from OFF to ON.

2. The buffer as set forth in claim 1, further comprising:

a first pFET; and a second pFET, wherein the first pFET and the second pFET are coupled to each other to switch ON and OFF in complementary fashion in response to the input voltage, wherein the pullup pFET is coupled to the second pFET so that the pullup pFET and the second pFET switch ON and OFF in complementary fashion.

3. The buffer as set forth in claim 2, further comprising:

a third pFET coupled to the first pFET to prevent the voltage at the drain of the first pFET from falling below $V_{L1}+V_{thL1}$, where $V_{L1}$ and $V_{thL1}$ are, respectively, the gate bias and threshold voltages of the third pFET; and a fourth pFET coupled to the second pFET to prevent the voltage at the drain of the second pFET from falling below $V_{R1}+V_{thR1}$, where $V_{R1}$ and $V_{thR1}$ are, respectively, the gate bias and threshold voltages of the fourth pFET.

4. The buffer as set forth in claim 3, wherein the gates of the third pFET and the fourth pFET are biased to the same bias voltage.

5. The buffer as set forth in claim 3, further comprising:

a first nFET coupled to the third pFET, the first nFET if ON to switch the third pFET OFF; and a second nFET coupled to the fourth pFET, the second nFET if ON to switch the fourth pFET OFF.

6. The buffer as set forth in claim 5, wherein the gates of the first nFET and the second nFET are biased.

7. The buffer as set forth in claim 6, further comprising:

a third nFET coupled to the first nFET to switch, if ON, the first nFET ON; and a fourth nFET coupled to the second nFET to switch, if ON, the second nFET ON.

8. The buffer as set forth in claim 7, wherein the first nFET is coupled to the third nFET to prevent the voltage of the drain of the third nFET from exceeding $V_{L2}-V_{thL2}$, where $V_{L2}$ and $V_{thL2}$ are, respectively, the gate bias and threshold voltages of the first nFET; and the second nFET is coupled to the fourth nFET to prevent the voltage of the drain of the fourth nFET from exceeding $V_{R2}-V_{thR2}$, where $V_{R2}$ and $V_{thR2}$ are, respectively, the gate bias and threshold voltages of the second nFET.

9. A buffer having an input node with an input voltage, the buffer comprising:

a pullup pFET;

a biasing circuit;

a driver pFET having a source connected to the drain of the pullup pFET, and having a gate connected to the biasing circuit;

a driver nFET having a drain connected to the drain of the driver pFET, and having a gate connected so as to be biased; and a pulldown nFET having a drain connected to the source of the driver nFET;

wherein the pullup pFET and pulldown nFET are coupled to the input node to switch in complementary fashion in response to the input voltage; and wherein the biasing circuit comprises an nFET having a drain connected to the gate of the driver pFET and coupled to the input node so as to switch ON for a transitory period when the pullup pFET switches from OFF to ON.

10. The buffer as set forth in claim 9, further comprising:

a first pFET, wherein the pullup pFET has a gate coupled to the second pFET to be responsive to the drain voltage of the second pFET;

a supply voltage circuit;

a second pFET, wherein the gate of the pullup pFET is coupled to the second pFET to be responsive to the drain voltage of the second pFET; wherein the gate of the first pFET is connected to the drain of the second pFET, the gate of the second pFET is connected to the drain of the first pFET, and the sources of the first pFET and the second pFET are connected to the supply voltage circuit so as to be at substantially the same voltage;

a third pFET, having a source connected to the drain of the first pFET and to the gate of the second pFET; and a fourth pFET, having a source connected to the drain of the second pFET and to the gate of the first pFET, wherein the gates of the first pFET and the fourth pFET are connected to be biased.

11. The buffer as set forth in claim 10, further comprising:

a first nFET having a drain connected to the drain of the third pFET;

a second nFET having a drain connected to the drain of the third pFET, wherein the gates of the first nFET and the second nFET are connected to be biased;

a third nFET having a drain connected to the source of the first nFET; and a fourth nFET having a drain connected to the source of the second nFET, wherein the gates of the first nFET and the fourth nFET are connected so as to have complementary logic voltages.

* * * * *